United States Patent [19]

Kjar

[11] 3,745,370

[45] July 10, 1973

[54] CHARGE CIRCUIT FOR FIELD EFFECT TRANSISTOR LOGIC GATE

[75] Inventor: Raymond A. Kjar, Newport Beach, Calif.

[73] Assignee: North American Rockwell Corporation, El Segundo, Calif.

[22] Filed: Dec. 2, 1971

[21] Appl. No.: 204,246

[52] U.S. Cl. .................................. 307/205, 307/251

[51] Int. Cl. ........................................... H03k 19/08

[58] Field of Search.................... 307/246, 251, 304, 307/205, 221 C, 279

[56] References Cited

UNITED STATES PATENTS

| | | | |
|---|---|---|---|
| 3,311,756 | 3/1967 | Nagata et al. | 307/304 |
| 3,059,123 | 10/1962 | Pfann | 307/251 |
| 3,513,405 | 5/1970 | Carlson | 307/304 X |
| 3,543,055 | 11/1970 | Stanes | 307/251 X |
| 3,268,827 | 8/1966 | Carlson et al. | 307/251 X |
| 3,348,062 | 10/1967 | Carlson et al. | 307/304 X |
| 3,502,909 | 3/1970 | Christensen et al. | 307/251 |
| 3,512,012 | 5/1970 | Kosowsky et al. | 307/304 X |
| 3,521,141 | 7/1970 | Walton | 307/246 X |

*Primary Examiner*—John W. Huckert
*Assistant Examiner*—R. E. Hart
*Attorney*—L. Lee Humphries et al.

[57] ABSTRACT

A logic gate having a field effect transistor (FET) connected between an output capacitor and an input logic network. An electrical contact provided to the FET base (substrate) region receives a precharge signal for precharging the output capacitor through the FET base-drain diode junction and for precharging capacitance of the logic network through the FET base-source diode junction. The logic network is evaluated following the precharge interval to conditionally discharge the output capacitor through the FET as a function of the logic state of the network. The invention herein described was made in the course of or under a contract or subcontract thereunder, with the Air Force.

5 Claims, 3 Drawing Figures

INVENTOR
RAYMOND A. KJAR
BY Robert G. Rogers
ATTORNEY

CHARGE CIRCUIT FOR FIELD EFFECT TRANSISTOR LOGIC GATE

BACKGROUND OF THE INVENTION

1. Field of the Invention

The invention relates to a precharge circuit for a field effect transistor logic gate therefor.

2. Description of Prior Art

One example of a pre-existing multiple phase logic gate can be seen by referring to U.S. Pat. No. 3,526,783 which shows in FIG. 2 a precharge circuit comprising field effect transistor 21 connected in electrical series with output capacitor 20. During $\phi_1$, the output capacitor is charged. During $\phi_2$, the isolation field effect transistor 28 is turned on to permit the capacitor 20 to discharge or remain charged as a function of the logic state of the logic network 30. For example, if the logic network is true during $\phi_2$, the capacitance of the charge on capacitor 20 is discharged to the electrical ground potential appearing on terminal 19. However, if the logic network is false, such as if either of the field effect transistors is non-conducting, the capacitor 20 remains charged.

In other examples of prior art circuits, resistors have been used in place of field effect transistor 21 of the referenced patent as part of the charge circuit. In still other logic gates, an isolation transistor such as 28 is not utilized such that the charging or discharging of the output capacitor occurs during the first interval as a function of the inputs to a logic network.

It is also well-known that field effect transistor precharging circuits experience a voltage drop equal to the threshold voltage of the precharge transistor. For example, in certain circuits, this loss may be as much as 6 volts, in which case the capacitor is charged to a voltage 6 volts less than that of the precharge clock. As a result relatively high clock voltages and voltage sources are often required. Care must be taken to prevent other losses due to charge splitting etc. so that sufficient drive voltage is available at the output of the logic gate.

Field effect transistors may also be harmfully effected by radiation. The radiation causes positive charges to accumulate in the insulating layer e.g. $SiO_2$, under the gate electrode. As a result, the threshold voltage of the field effect transistor may be substantially increased. The accumulated positive charges permanently alter the operating voltage levels of the field effect transistor.

Therefore, a logic gate is desired for providing a relatively simple charging circuit which would eliminate components, require less substrate area, and therefore enable the manufacture of relatively less expensive integrated circuits. In addition, a logic gate is preferred which can minimize the harmful effects of radiation.

SUMMARY OF THE INVENTION

Briefly the invention comprises a logic gate having a first field effect transistor connected in electrical series between an output terminal and a logic network. Ordinarily the output terminal includes inherent capacitance. However, a discrete output capacitor may be added, if required. A precharge electrode is connected to the substrate or base region of the first field effect transistor, and in operation, a first clock signal is applied to the precharge electrode with a polarity for causing current to flow through the junction between the base region and an adjacent semiconductor region of opposite conductivity in order to precharge the output capacitor. For example, the base region may comprise N-type silicon and the adjacent drain electrode of the field effect transistor may comprise a diffused P-region. In that case, a negative voltage applied to the base electrode would produce current flow through the drain-base PN junction for charging the output capacitor. Similarly, current flow through the transistor source-base junction is employed to precharge capacitance associated with the logic network. The first operating interval is referred to as the precharge interval.

Subsequently, a clock signal is applied to the gate electrode of the first field effect transistor for electrically connecting a output to the first terminal of the logic network. A second terminal of the logic network is connected to electrical ground during the second interval. If the logic network, which may be comprised of one or more field effect transistors in various logic configurations, is true, the charge on the output capacitor is discharged through the first field effect transistor and through the logic network to the electrical ground voltage level on the second terminal of the logic network. In effect, the output capacitor is charged to a first voltage level during the precharge interval and is conditionally discharged to a second voltage level during a second interval when the inputs to the logic network, i.e. the logic state of the logic network, is being evaluated.

The second terminal of the logic network may be connected to a clock signal which is true during the first interval and false during the second interval. In that way, during the first interval when the output capacitor is being precharged, less power will be dissipated in the event a conduction path exists through the logic network during the first interval. The same clock signal as was applied to the precharge electrode could also be applied to the second terminal of the logic network.

In a preferred embodiment, the clock signal which is applied to the gate electrode of the first field effect transistor is also true during the first interval. In other words, the true interval of the gate clock signal overlaps the true interval of the precharge clock. For example, the precharge clock may be a $\phi_1$ clock signal whereas the clock on the gate electrode may be a $\phi_{1+2}$ clock signal. The clock signals are often referred to as minor and major to designate the relative widths of their true intervals.

Since the base drain junction of the first field effect transistor is used as the charge circuit, a relatively small amount of voltage drop is involved. Therefore, a relatively lower clock signal can be used if desired. In addition, since the field effect of the field effect transistor is not involved during the precharge interval, any positive charges accumulated in the oxide under the gate electrode do not reduce the level of the precharge voltage at the output. Therefore, a relatively large amount of drive voltage is always available at the output regardless of radiation damage to a field effect transistor device. In addition, if the $\phi_{1+2}$ clock signal is applied to the gate electrode simultaneously with the application of the $\phi_1$ clock to the precharge electrode, the harmful effects of radiation exposure are minimized. In other words, the threshold voltage level of the field effect transistor is changed relatively slightly. Moreover, the present circuit is relatively inexpensive to produce and requires fewer components and less substrate layout area.

Other advantages and objects of this invention will be apparent from the following description taken in conjunction with the description of the drawings.

DESCRIPTION OF THE PREFERRED EMBODIMENT

Figure 1:
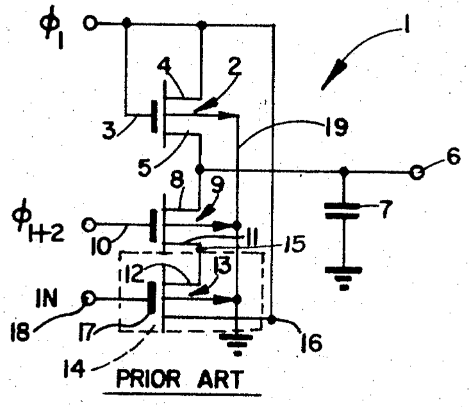
FIG. 1 is a schematic diagram of an example of a prior art circuit using a charging field effect transistor as a precharge circuit.

FIG. 1 illustrates one example of a prior art logic gate 1 comprising a precharge field effect transistor 2, also called a load field effect transistor, having its gate electrode 3 and drain electrode 4 connected to a first clock signal $\phi_1$. Its source electrode 5 is connected to the output terminal 6. Capacitor 7 which may be inherent or an effective capacitor is connected between the output terminal 6 and electrical ground. The source electrode 5 of field effect transistor 2 is connected to drain electrode 8 of an isolation field effect transistor 9 which has its gate electrode 10 connected to a double width clock signal $\phi_{1+2}$. The source electrode 11 of field effect transistor 9 is connected to the drain electrode 12 of field effect transistor 13. Field effect transistor 13, in effect, is one embodiment of a logic network 14 having terminals 15 and 16. Terminal 16 is connected to $\phi_1$. The gate electrode 17 of field effect transistor 13 is connected to receive a data input signal at terminal 18. The substrates of transistors 2, 9 and 13 are connected to electrical ground represented by line 19.

In operation, during $\phi_1$, field effect transistor 2 is turned on and a first voltage level represented by the voltage level of the clock signal $\phi_1$, as reduced by the threshold drop across field effect transistor 2, is used to precharge the output capacitor 7. The true period of the $\phi_1$ clock is called a precharge interval. Field effect transistor 9 is also on during $\phi_1$ so that the $\phi_1$ voltage level (reduced by the threshold drop across field effect transistor 2, is also applied to terminal 15 of logic network 14 for precharging the inherent capacitance (not shown) connected to the terminal 15. Precharging of the inherent capacitance at the upper terminal 15 of the logic network is usually done to prevent charge splitting (in other words, division of charge between the output capacitor 7 and the inherent capacitance connected to the upper terminal 15 of the logic network 14).

During $\phi_2$, field effect transistor 9 remains on so that if the input signal on terminal 18 is true, a relatively low impedance path exists between the terminals of the logic network so that the charge on capacitor 7 is discharged to electrical ground. As a result, the output signal at terminal 6 changes from a first voltage level e.g. $\phi_1$ (reduced by a threshold drop) to a second voltage level e.g. electrical ground. On the other hand, if the input signal on terminal 18 had been false, the capacitor 7 would have remained charged to the first voltage level.

As can be seen from FIG. 1, the precharge circuit comprises the field effect transistor 2. Obviously, extra substrate layout area is required in order to produce the field effect transistor. In the event the logic gate is exposed to radiation, the threshold voltage of the field effect transistor 2 as well as the other field effect transistors is permanently altered. Ordinarily the threshold voltage is increased such that a greater voltage is required to turn the field effect transistors on or, a greater drop occurs across field effect transistors. In the event the threshold is increased, for example, from 6 to 12 volts, and assuming a clock signal of 25 volts, instead of precharging the output capacitor to 19 volts as would normally be the case, the output capacitor would be charged to approximately 13 volts. If other devices on the same substrate had been exposed or were exposed to the radiation, 13 volts would be barely enough to enable the other devices to become conductive during another operating interval. As a result, the operability of the logic circuit which had been exposed to the radiation would be substantially impaired.

Figure 2:
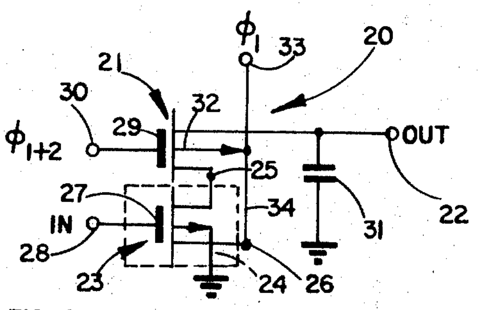
FIG. 2 is a schematic diagram of one embodiment of an improved logic gate with a PN junction of the field effect transistor used during the evaluation of the inputs as a precharge circuit.

The FIG. 2 logic gate 20 eliminates the charge circuit represented by field effect transistor 2 in FIG. 1 and therefore provides an improved logic gate which requires one less component and less layout area on a substrate. In addition, the logic gate 20 is less affected by exposure to radiation.

The logic gate 20 comprises field effect transistor 21 connected in electrical series between the output terminal 22 and field effect transistor 23 representing logic network 24 comprising terminals 25 and 26. Field effect transistor 23 has its gate electrode 27 connected to receive a data input signal on terminal 28. The gate electrode 29 of field effect transistor 21 is connected to receive a $\phi_{1+2}$ clock signal on terminal 30. If desired, a $\phi_2$ clock signal could be used to control the conduction of field effect transistor 21. The capacitor 31 is connected between the output terminal 22 and electrical ground. For purposes of describing one embodiment of the logic gate, the voltage level represented by the clock signals, is referred to as the first voltage level, is negative and is adopted as a true logic state. The voltage level represented by electrical ground is referred to as the second voltage level and is adopted as a false logic state. It is also pointed out that although a single field effect transistor is used to represent the logic network 24, one or more field effect transistors could be added to implement various logic functions. For example, AND, OR, NOR, NAND, and other logic configurations could be implemented by techniques as known to persons skilled in the art. Although not shown, it should also be understood that inherent capacitances associated with the conductor junction of the logic gates 20 are eliminated for convenience.

Precharge electrode 32 is connected to the substrate or base region of field effect transistor 21. The precharge electrode is connected to receive clock signal $\phi_1$ on terminal 33. The clock signals are also applied via conductor 34 to the second terminal 26 of logic network 34. As a result, during the precharge interval, power dissipation which could otherwise result if field effect transistor 23 were turned on during $\phi_1$, is eliminated. In another embodiment, where power dissipation may not be a problem, the connection of the $\phi_1$ clock signal to the second terminal 26 of the logic network can be eliminated and the second terminal can be connected to electrical ground.

It is pointed out that the precharge electrode 32 is connected directly to the base region. In some instances, an impurity is diffused into this region for providing an improved contact between a metal contact layer such as aluminum and the gate region. The gate electrode 29 on the other hand is separated from the base region by an insulating layer such as $SiO_2$.

In operation, when the clock $\phi_1$ is true, called the precharge interval herein, a voltage is applied to the precharge electrode 32. The voltage has the proper polarity for enabling current to flow through the junction formed between the base region and the claim region of field effect transistor 21. In other words, the base region is comprised of one type of conductivity semiconductor material such as N-type and the adjacent drain region is comprised of an opposite conductivity type semiconductor material such as P-type material. Therefore, if the $\phi_1$ clock is a negative voltage level, e.g. −25 volts, the base-drain PN junction is forward biased, and current flows through the PN junction to precharge the output capacitor 31 to approximately −25 volts. A slight voltage is dropped across the PN junction. For example less than one volt may be dropped.

During $\phi_2$, referred to as the input evaluation interval, the field effect transistor 21 is turned on for electrically connecting the output and capacitor 31 in electrical series with the logic network 24. If the input signal on terminal 28 is true, a relatively low impedance path exists through the logic network e.g. between the first and second terminals of the logic network so that the output capacitor charged to the first voltage level during the precharge interval discharges to the voltage level on terminal 26 during $\phi_2$. Since the $\phi_1$ clock or terminal 26 is false, or at electrical ground, during $\phi_2$, the capacitor discharges to the second voltage level represented by electrical ground during the input evaluation interval when the logic network is true. On the other hand, if the input signal on terminal 28 had been false, a relatively high impedance path would have existed between the two terminals of the logic network and the output capacitor would have remained charged to approximately −25 volts.

Charge splitting between the output capacitor and the inherent capacitance connected to the upper terminal 25 is eliminated since during the precharge interval when current is flowing across the PN junction for precharging the output capacitor, current is also available to flow across the adjacent PN junction comprised of the base region and the source electrode of field effect transistor 21 to precharge the inherent capacitance connected to the upper terminal 25.

As a result of providing a precharge circuit comprising a precharge electrode connected to the base region, a relatively higher drive voltage can be produced with the same clock signal voltage level. However, if desired, the clock signal voltage level can be reduced. It is also pointed out that even if the logic gate is exposed to radiation, the radiation would not substantially affect the drop across the PN junction. As a result, even though the threshold voltage level of the field effect transistor would be increased, the output would still be precharged to approximately the clock signal voltage level. The radiation damage, therefore, which could increase the threshold voltage level of the field effect transistors would have less effect since the drive voltages for the devices would still remain relatively high.

Figure 3:
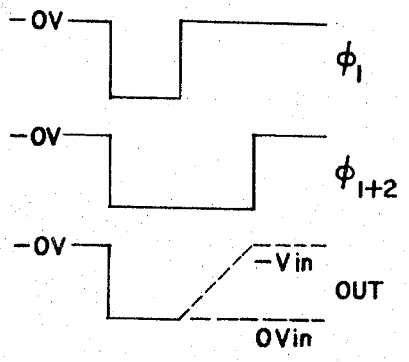
FIG. 3 is a signal diagram of the clock signals and output voltage levels used with the FIG. 2 logic gate.

It is further pointed out that although the $\phi_2$ clock signal could be used to control the conduction of field effect transistor 21, in the preferred embodiment, a $\phi_{1+2}$ clock signal is used. As a result, during $\phi_1$ when the output is being precharged, the gate electrode of field effect transistor 21 is connected to a negative voltage level approximate or equal to the $\phi_1$ voltage level as shown in FIG. 3. Both signals have the same voltage level. Therefore, as is known to persons skilled in the art, if the field effect transistor is exposed to radiation during the first interval, the change in operating characteristics e.g. threshold voltage level would be relatively slight since the gate to base voltage would be zero and would not be a positive voltage level. However, to a certain extent, the same comment can be made relative to the logic gate 1. During $\phi_1$, the gate to base voltage level is negative. The substrate of gate 1 is connected to electrical ground by line 19 so that during an operating cycle, a negative gate to base (substrate) voltage would be provided.

The clock signal $\phi_1$ and $\phi_{1+2}$ are shown in FIG. 3. In addition, the output wave form whenever the input signal is true is also shown. Since a relatively low impedance path exists between the capacitor precharge circuit and the output, the output is seen to change from a false to a true voltage level instantaneously during $\phi_1$. In the event the logic network input is true during $\phi_2$, the output capacitor 31 discharges at a relatively slower rate to electrical ground representing a false voltage level.

I claim:

1. A field effect transistor logic gate comprising:

a field effect transistor having a base region, source and drain means forming junctions with said base region, gate means for controlling current flow between said source and drain means, and an electrode connected to said base region;

an output terminal;

a logic network having two terminals;

means connecting said field effect transistor in electrical series between said output terminal and one terminal of said logic network;

potential means applied to said electrode and poled to provide current flow paths from said electrode through respective ones of said junctions to said one terminal of said logic network and to said output terminal during a first operating interval;

means connected to apply input signals having first and second logic levels to said logic network, said logic network assuming a conductive condition between said two terminals in response to an input signal of said first level and assuming a blocked condition in response to an input signal of said second level;

means connected to said gate means during a second operating interval, for turning on said field effect transistor during said second operating interval to connect said output terminal to said logic network, whereby an output signal is derived dependent upon the condition of the logic network.

2. A logic gate as in claim 1 and further including capacitance means associated with said one terminal and said output terminal, said capacitance means being precharged by said current flow during said first operating interval and being conditionally discharged through the series path of said field effect transistor and said logic network during said second operating interval.

3. A field effect transistor logic gate having an operation cycle determined by multiple phase clock signals wherein said cycle includes a precharge interval followed by an input evaluation interval, said logic gate comprising:

a first field effect transistor having a base region, source and drain means forming diode junctions with said base region, gate means for controlling current flow between said source and drain means, and a precharge electrode connected to said base region;

an output terminal;

first capacitance means connected to said output terminal;

a two-terminal logic network including at least a second field effect transistor having source, drain, and gate electrodes with its source-to-drain path connected between the two logic network terminals;

means connecting said first field effect transistor in electrical series between said output terminal and one terminal of said logic network;

second capacitance means connected to said one terminal of said logic network;

first clock signal means connected to said precharge electrode during said precharge interval and poled to provide current flow paths from said electrode through respective ones of said diode junctions to said one terminal of said logic network and to said output terminal to precharge said first and second capacitance means during said precharge interval;

means connected to the gate electrode of said second field effect transistor for applying input signals having first and second logic levels, said logic network assuming a conductive condition between said terminals in response to an input signal of said first level and assuming a blocked condition in response to an input signal of said second level; and second clock signal means connected to said gate means of said first field effect transistor at least during said input evaluation interval for turning on said first field effect transistor during said input evaluation interval to connect said output terminal to said logic network, whereby said first capacitance means is conditionally discharged through said first field effect transistor and said logic network to derive an output signal dependent upon the condition of the logic network.

4. The logic gate as in claim 3 wherein said second clock signal means is connected to said gate means during both said precharge interval and said input evaluation interval.

5. The logic gate as in claim 4 wherein said first clock signal means is further connected to the second terminal of said logic network during said precharge interval to prevent premature power dissipation through said logic network prior to said input evaluation interval.

* * * * *

PO-1050
(5/69)

UNITED STATES PATENT OFFICE
CERTIFICATE OF CORRECTION

Patent No. 3,745,370 Dated July 10, 1973

Inventor(s) Raymond A. Kjar

It is certified that error appears in the above-identified patent and that said Letters Patent are hereby corrected as shown below:

Column 2, line 14, change "a" to -- the --.

after "output" insert -- terminal -- .

after "to", change "the" to -- a -- .

Column 3, line 5, after "the" (second occurrence) insert -- accompanying -- .

line 48, change "," to -- ) -- .

Column 5, line 5, change "gate" (first occurrence) to -- base -- .

line 8, change "clock $\phi_1$" to -- $\phi_1$ clock -- .

line 12, change "claim" to -- drain -- .

line 34, change "or" to -- on -- .

line 35, "or" should read -- i.e. --.

Column 7, line 15, delete -- two-terminal -- .

line 15, after "network" insert -- having two terminals and -- .

Signed and sealed this 19th day of November 1974.

(SEAL)
Attest:

McCOY M. GIBSON JR.
Attesting Officer

C. MARSHALL DANN
Commissioner of Patents